United States Patent [19]
Koga

[11] 4,144,543
[45] Mar. 13, 1979

[54] PREDICTIVE CODEC CAPABLE OF SELECTING ONE OF AT LEAST THREE PREDICTION SIGNALS IN TWO STEPS

[75] Inventor: Toshio Koga, Tokyo, Japan

[73] Assignee: Nippon Electric Co., Ltd., Tokyo, Japan

[21] Appl. No.: 861,340

[22] Filed: Dec. 16, 1977

[30] Foreign Application Priority Data

Dec. 16, 1976 [JP]   Japan .................................. 51/151526
May 12, 1977 [JP]   Japan .................................. 52/55069
Jun. 6, 1977 [JP]    Japan .................................. 52/67148
Jun. 6, 1977 [JP]    Japan .................................. 52/67149

[51] Int. Cl.$^2$ ............................................. H04N 7/12
[52] U.S. Cl. .................................. 358/136; 325/38 B; 358/138; 364/515
[58] Field of Search ............... 358/133, 135, 136, 138, 358/260, 261; 364/515; 325/38 B

[56] References Cited

U.S. PATENT DOCUMENTS

| | | | |
|---|---|---|---|
| 2,946,851 | 7/1960 | Kretzmer | 358/138 |
| 3,568,063 | 3/1971 | Brown | 358/138 |
| 4,075,655 | 2/1978 | Iijima | 364/515 |
| 4,077,053 | 2/1978 | Ishiguro | 358/136 |

*Primary Examiner*—Howard W. Britton
*Attorney, Agent, or Firm*—Sughrue, Rothwell, Mion, Zinn and Macpeak

[57] ABSTRACT

A predictive encoder produces a prediction error signal in response to an autocorrelated signal, such as a television broadcast signal. The encoder includes a prediction signal producing circuit for producing several prediction signals for each sample element of the autocorrelation signal. The several prediction signals comprise preferably a single intraframe prediction signal and a group of interframe or interfield prediction signals. The group of prediction signals are compared with the sample element of the autocorrelation signal to produce a selection signal indicative of which one of the group gives the best approximation of the autocorrelated signal. The prediction signal of the group giving the best approximation along with the intraframe prediction signal are selected out of the total number of prediction signals. A further selection is made between the two first selected prediction signals according to a prediction error signal. The last selected prediction signal is compared with the autocorrelation signal to form a prediction error signal which is transmitted along with the selection signal. A predictive decoder for use in combination with the encoder reproduces the prediction error signal, and the selection signal produces the prediction signals corresponding to those used in the encoder, selects at least two thereof according to the reproduced selection signal, and again selects one of the last-mentioned at least two prediction signals according to the reproduced prediction error signal.

11 Claims, 14 Drawing Figures

FIG 4

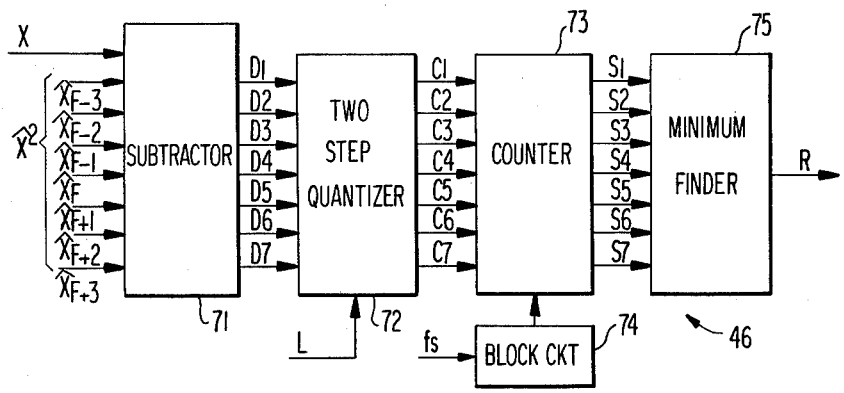

FIG 5

| X | $X_{-2} X_{-1} X_0 X_1 X_2 X_3 X_4 X_5 X_6 X_7 X_8 X_9 X_{10} X_{11} X_{12} X_{13} X_{14}$ |
|---|---|
| B | $B_{-1}$ \| $B_0$ \| $B_1$ |
| $\hat{X}_{F-3}$ | $\hat{X}_0 \hat{X}_1 \hat{X}_2 \hat{X}_3 \hat{X}_4 \hat{X}_5 \hat{X}_6 \hat{X}_7 \hat{X}_8 \hat{X}_9 \hat{X}_{10} \hat{X}_{11} \hat{X}_{12} \hat{X}_{13} \hat{X}_{14} \hat{X}_{15} \hat{X}_{16} \hat{X}_{17}$ |
| $\hat{X}_F$ | $\hat{X}_{-2} \hat{X}_{-1} \hat{X}_0 \hat{X}_1 \hat{X}_2 \hat{X}_3 \hat{X}_4 \hat{X}_5 \hat{X}_6 \hat{X}_7 \hat{X}_8 \hat{X}_9 \hat{X}_{10} \hat{X}_{11} \hat{X}_{12} \hat{X}_{13} \hat{X}_{14}$ |
| $\hat{X}_{F+3}$ | $\hat{X}_{-4} \hat{X}_{-3} \hat{X}_{-2} \hat{X}_{-1} \hat{X}_0 \hat{X}_1 \hat{X}_2 \hat{X}_3 \hat{X}_4 \hat{X}_5 \hat{X}_6 \hat{X}_7 \hat{X}_8 \hat{X}_9 \hat{X}_{10} \hat{X}_{11}$ |
| R | $R_{-1}$ \| $R_0$ \| $R_1$ |
| XT | $X_{-4} X_{-3} X_{-2} X_{-1} X_0 X_1 X_2 X_3 X_4 X_5 X_6 X_7 X_8 X_9 X_{10} X_{11} X_{12}$ |

FIG 6

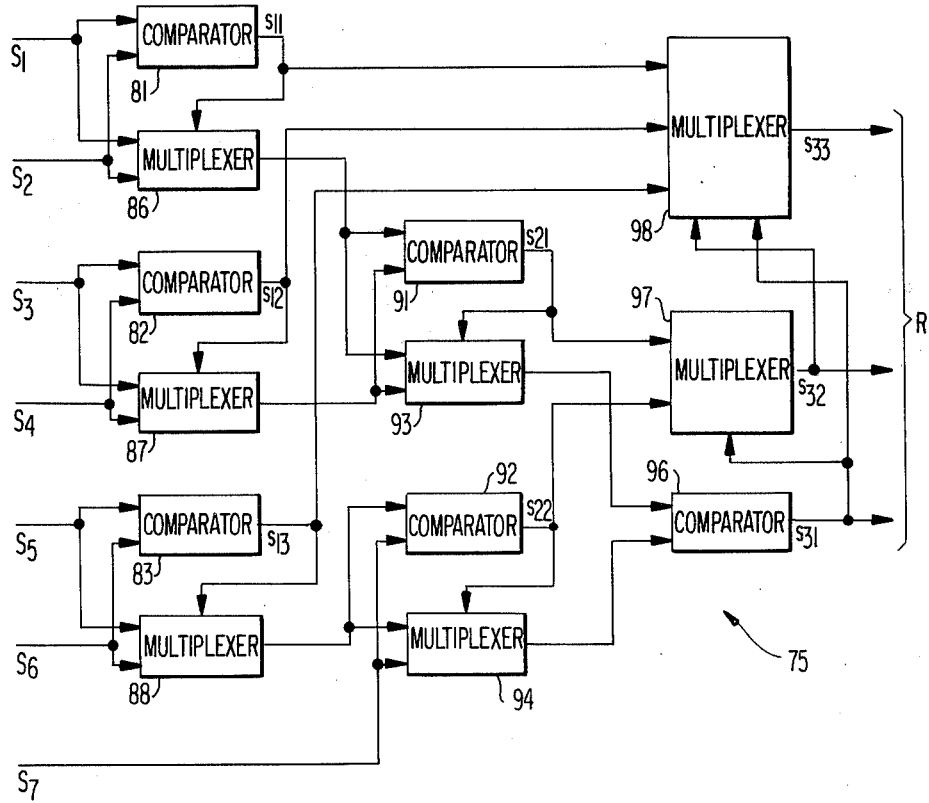

PREDICTIVE CODEC CAPABLE OF SELECTING ONE OF AT LEAST THREE PREDICTION SIGNALS IN TWO STEPS

BACKGROUND OF THE INVENTION

This invention relates to a system for carrying out predictive encoding of an autocorrelated signal into an encoded signal and/or predictive decoding of an encoded signal derived by the predictive encoding from an autocorrelated signal into a reproduction of the last-mentioned autocorrelated signal. An example of the autocorrelated signals to which this invention is applicable is a television broadcast signal.

In a television signal, picture signals have a strong degree of correlation along both horizontal and vertical directions of each picture and along the time axis. It is therefore possible, by resorting to predictive encoding and decoding, to reduce the amount of information to be actually transmitted. According to predictive encoding applied to the picture signals, each picture element is represented by the instantaneous amplitude of a prediction error signal which is the difference between an unprocessed signal for the picture element and a prediction signal derived for an adjacent picture element. In intraframe predictive encoding, such as element-to-element or line-to-line predictive encoding, the prediction signal is derived from a signal for a picture element within the same frame. In interfield or field-to-field predictive encoding, a corresponding picture element in a next previous field to the picture element in question is used for deriving the prediction signal. In interframe predictive encoding, such as frame-to-frame predictive encoding, a picture element used to derive the prediction signal corresponds in a next previous frame to the element in question. Use is also possible of a combined prediction signal obtained by a combination of the above-named modes of predictive encoding and, if desired, other similar modes of predictive encoding. The intraframe predictive encoding provides high efficiency results in the case of pictures which do not have sharp contrast. The interframe predictive encoding shows an excellent efficiency when applied to pictures of still or slightly moving objects. The interfield and combined predictive encoding provides result intermediate the intraframe and interframe predictive encoding.

In a conventional predictive encoder for a television signal, use is generally made of only one of various manners of predictive encoding. This is objectionable for a television broadcast signal in which the scenes being televised may vary slightly and severely at different times, and may sometimes be simple and at other times complicated. In "Conference Record", Volume II, pages 27-12 et seq., of International Conference on Communications held June 16-18, 1975, in San Francisco, California, the United States (IEEE Catalogue No. 75 CH 0971-2 CSCB), a predictive encoder is proposed with reference to FIG. 4 (pages 27-13). The proposed encoder is operable in both modes of intraframe and interframe predictive encoding. Once in each block interval equal to a predetermined number of the picture elements, a mode controller checks which of the modes provides a higher efficiency for the time being and selects the more efficient mode. With this encoder, it is necessary to transmit the information representative of the mode along with the prediction error signal. Also, it is inevitable that the efficiency is seriously adversely affected when the scene being televised varies severely. In any event, the proposed encoder is complicated in structure and is incapable of reducing the total amount of information of transmission by as much as expected.

For the television signal, the three predetermined durations may be any three of the following: an interval between two adjacent picture elements; a horizontal line period; a field period; a frame period; and a like period. It is therefore possible to say for an autocorrelated signal of the type described that one of the predetermined durations is equal at least to the equal spacing between two adjacent ones of the instants and that others of the predetermined durations are longer than the above-mentioned one predetermined duration. The prediction error signal as named herein has an amplitude variable from one of the instants to another in compliance with the autocorrelated signal.

SUMMARY OF THE INVENTION

It is therefore an object of the present invention to provide a system for carrying out, with an excellent efficiency, predictive encoding of an autocorrelated signal of the type specified hereinabove into an encoded signal and/or predictive decoding of an encoded signal derived from an autocorrelated signal of the specified type into a reproduction of the last-mentioned autocorrelated signal.

It is another object of this invention to provide a system of the type described, which is capable of carrying out the predictive encoding by selecting one of at least three modes of predictive encoding that provides a highest possible efficiency at every instant.

It is still another object of this invention to provide a system of the type described which is capable of carrying out the predictive decoding in response to the encoded signal carrying a least possible amount of information.

According to this invention, there is provided a system comprising a predictive encoder for producing an encoded signal representative of an autocorrelated signal supplied thereto and a predictive decoder responsive to the encoded signal for reproducing the autocorrelated signal. The autocorrelated signal takes those values at equally-spaced successive instants which are substantially correlated to the values the autocorrelated signal takes each of a plurality of predetermined durations after the respective instants. One of the predetermined durations is equal at least to the equal spacing between two adjacent ones of the successive instants, while others of the predetermined durations are longer than the above-mentioned one predetermined duration. The encoded signal comprises a prediction error signal and a control signal interspersed in the prediction error signal. The prediction error signal has an amplitude variable from one of the successive instants to another thereof in compliance with the autocorrelated signal. The predictive encoder comprises encoder prediction means responsive to an encoder local signal supplied thereto at each of the successive instants for producing at least three prediction signals of predicted values predictive with approximation of actual values that the autocorrelated signal takes at least three of the predetermined durations after the above-mentioned each instant, respectively. The predicted values consequently correspond to the actual values, respectively. The predictive encoder further comprises first encoder means responsive to the autocorrelated signal and the prediction signals for comparing the predicted values with the corresponding ones of the actual values to produce once in each block interval equal to a predetermined number of the equal spacings a selection signal indicative of each of those at least two of the prediction signals which are of the predicted values predictive of the actual values corresponding to the predicted values of the above-mentioned at least two prediction signals with better approximation than the prediction signal other than the at least two prediction signals, encoder selection means responsive to the selection signal for selecting the above-mentioned each prediction signal, second encoder means responsive to the autocorrelated signal and the at least two prediction signals for producing at each of the successive instants an encoder switching signal according to a first predetermined rule, encoder switching means responsive to the switching signal for selecting according to a second predetermined rule one of the at least two prediction signals as an encoder switched signal, means responsive to the autocorrelated signal and the switched signal for producing the prediction error signal, means responsive to the prediction error signal and the switched signal for producing the local signal, and means for interspersing the selection signal in the prediction error signal as the control signal.

According to this invention, there is also provided a system of the type set forth in the next preceding paragraph wherein the predictive decoder comprises decoder prediction means responsive to a decoder local signal supplied thereto at each of the successive instants for producing at least three decoder prediction signals predictive of the values that the reproduced autocorrelated signal takes the abovementioned at least the three predetermined durations, respectively, after the instant of production of the decoder prediction signals, means responsive to the encoded signal supplied to the predictive decoder for reproducing the prediction error signal and the selection signal, decoder selection means responsive to the reproduced selection signal for selecting those at least two of the decoder prediction signals each of which the reproduced selection signal is indicative of, means responsive to the encoded signal supplied to the predictive decoder for producing at each of the successive instants a decoder switching signal according to a rule corresponding to the first predetermined rule, decoder switching means responsive to the decoder switching signal for selecting according to the second predetermined rule one of the at least two decoder prediction signals as a decoder switched signal, means responsive to the reproduced prediction error signal and the decoder switched signal for producing the decoder local signal, and means for producing the decoder local signal as the reproduced autocorrelated signal.

Even with a system according to this invention, it is necessary to transmit between a predictive encoder and a predictive decoder of the system a control or selection signal mentioned hereinabove. It is, however, unnecessary to transmit any information as regards switching at the encoder or decoder switching means between at least two encoder or decoder prediction signals. The amount of information to be transmitted at each instant is therefore much reduced. When the encoded signal is transmitted through a transmission channel, a reduction is possible in the rate of transmission. When the encoded signal is recorded on a recording medium, a reduction is possible of the amount of the medium. It is to be noted in connection with the above that a prediction error signal produced by a predictive encoder of a system according to this invention need not necessarily reach a predictive decoder of the system with exactly the same amplitude and waveform.

BRIEF DESCRIPTION OF THE DRAWING

FIG. 4 is a block diagram of a first comparator for use in the predictive encoder shown in FIG. 2.

FIG. 5 shows several signals that appear at various points in the predictive encoder comprising the prediction signal-producing circuits and the first comparator depicted in FIGS. 3 and 4.

FIG. 6 is a block diagram of a minimum finder for use in the first comparator shown in FIG. 4.

DESCRIPTION OF THE PREFERRED EMBODIMENTS

Figure 1:
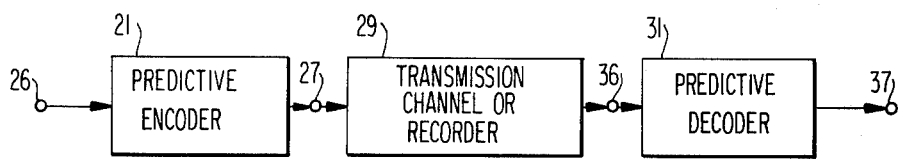
FIG. 1 is a block diagram of a system which comprises a predictive encoder and a predictive decoder and to which the instant invention is applicable.

Referring to FIG. 1, a system to which the present invention is applicable comprises a predictive encoder 21 for carrying out predictive encoding of an autocorrelated signal supplied thereto at an encoder input terminal 26 into an encoded signal delivered from an encoder output terminal 27. The encoded signal is supplied to a block 29, which may be either a transmission channel for transmitting the encoded signal to a predictive decoder 31 of the system or a recording device for recording the encoded signal for predictive decoding by the predictive decoder 31. The predictive decoder 31 has a decoder input terminal 36 for the encoded signal and a decoder output terminal 37 for a reproduction of the autocorrelated signal. It is surmised throughout the description that the autocorrelated signal is of the type specified in the preamble of the instant specification.

Figure 2:
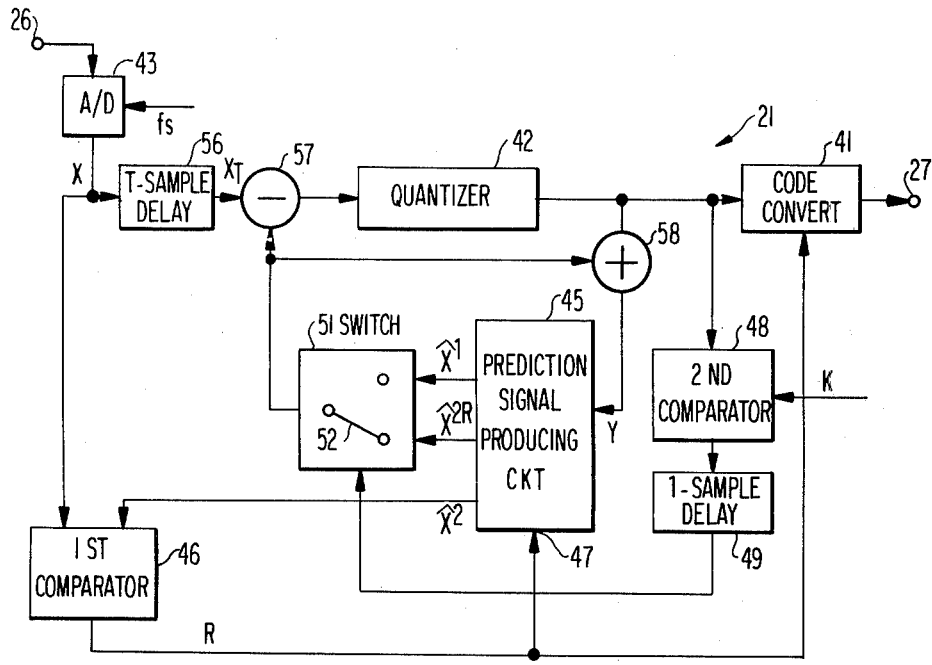
FIG. 2 is a block diagram of a predictive encoder according to a first embodiment of this invention.

Turning to FIG. 2, a predictive encoder 21, according to a first embodiment of this invention, has an encoder input terminal 26 for the autocorrelated signal and an encoder output terminal 27 for the encoded signal. The encoded signal is derived, in the illustrated example, from a prediction error signal known in the art and a control signal, described later, by a code converter 41 that is for primarily converting equal length codes into variable length codes. In pages 309-314 of an article contributed to the record of the Third International Conference on Digital Satellite Communications, held Nov. 11-13, 1975, in Kyoto, Japan, a circuit labelled "ADDRESS CODING" in FIG. 3 (page 312) is for carrying out the code conversion described on page 310 with reference to FIG. 6 (page 314). Inasmuch as a code converter of the type described is thus already known and has no direct connection with the gist of this invention, description will not be made of the details of the converter.

In the predictive encoder 21 depicted in FIG. 2, the prediction error signal is supplied to the code converter 41 after quantized by a quantizer 42 into a quantized prediction error signal. Inasmuch as the quantization is merely for raising the efficiency of compression of the amount of information to be actually transmitted to a counterpart predictive decoder, the quantized prediction error signal will herein again be called the prediction error signal. When the autocorrelated signal supplied to the input terminal 26 is an analog signal, the analog autocorrelated signal is converted to a digital autocorrelated signal X by an analog-to-digital converter 43 supplied with a sampling pulse sequence of a sampling frequency $f_s$, which defines the equally-spaced successive instants mentioned hereinabove and may be a sub-Nyquist sampling frequency. The predictive encoder 21 comprises at least three prediction signal-producing circuits 45 responsive to a locally decoded signal Y supplied thereto at each of the instants for simultaneously producing a first prediction signal $X^1$ of a first predicted value and at least two second prediction signals $X^2$ of second predicted values. The first predicted value is predictive, with approximation, of a first actual value the autocorrelated signal takes a first predetermined duration after the instant of production of the first prediction signal $X^1$. The second predicted values are predictive, also with approximation, of second actual values that the autocorrelated signal takes the respective ones of at least two second predetermined durations after the instant of simultaneous production of the second prediction signals $X^2$. The second predicted values therefore correspond to the second actual values, respectively, as pointed out in the preamble of this specification. Supplied with the autocorrelated signal X and the second prediction signals $X^2$, a first comparator 46 compares the second predicted values with the corresponding ones of the second actual values to produce at each of block intervals a selection signal R indicative of a specific one $X^{2R}$ of the second prediction signals $X^2$ that is the first approximation of the second actual values. The block interval is rendered equal to a predetermined number of the equal spacings between the successive instants. Although the number of the equal spacings is subject to no particular restriction, about eight is preferred as the number.

Further referring to FIG. 2, the selection signal R is supplied to a selection circuit symbolized at 47 for selecting the specific one of the second prediction signals $X^{2R}$ which the selection signal R is indicative of. The predictive encoder comprises a second comparator 48 for comparing the amplitude of the prediction error signal with a threshold level K of a threshold signal at each of the successive instants. Merely by way of example, the second comparator 48 produces a binary signal of a logic "1" and a logic "0" value when the amplitude is greater and not greater in absolute value than the threshold level K, respectively. The binary signal is supplied to a one-sample delay circuit 49 for producing a switching signal by giving a delay of one sample of equal spacing to the binary signal. Responsive to the switching signal, a switching circuit 51 carries out switching between the first prediction signal $X^1$ and the specific one of the second prediction signals $X^{2R}$ to produce a switched signal. For example, the switching circuit 51 produces, in response to a logic "1" switching signal, one of the two prediction signals $X^1$ and $X^{2R}$ that is different from the prediction signal selected at a next preceding instant as the switched signal and otherwise the same prediction signal as that which is produced at the preceding instant as the switched signal. The switching circuit 51 is biased, while inoperative, as symbolized by a mechanical switching arm 52 to produce a predetermined one of the two prediction signals $X^1$ and $X^{2R}$ as soon as put into operation. This is in order to keep correspondence between predictive encoding and decoding. For a television signal, a horizontal synchronizing signal appears at the beginning. It is therefore preferred that the predetermined one of the two prediction signals $X^1$ and $X^{2R}$ be a prediction signal for one of the first and second predetermined durations that is equal to or longer than a field period, such as an interfield or an interframe prediction signal. Incidentally, it is possible with a switching signal and a switching circuit 51 of the types described to carry out switching among three or more prediction signals with preference predetermined among the three or more prediction signals.

Still further referring to FIG. 2, it may be mentioned here that the first comparator 46 produces the selection signal R with a delay of T samples or equal spacings, such as two samples. The specific one of the second prediction signals $X^{2R}$ supplied to the switching circuit 51 is therefore delayed by T samples as compared with the second prediction signals $X^2$ supplied to the first comparator 46 and should be designated by $X^2$ when the T-sample delay is taken into account. In order to produce the prediction error signal with correct timing, the predictive encoder comprises a T-sample delay circuit 56 for giving the autocorrelated signal a T-sample delay to produce a T-sample delayed autocorrelated signal $X_T$. The first prediction signal $X^1$ should also be a T-sample delayed signal $X^1_T$. At any rate, the switched signal is subtracted from the delayed autocorrelated signal $X_T$ by a subtractor 57 to provide the prediction error signal. The switched signal is added to the prediction error signal by an adder 58 to provide the locally decoded signal. The selection signal R is supplied to the code converter 41 to be interspersed or interposed in the prediction error signal as a control signal. A code converter 51 having such an interspersing capability is already known as described, for example, in U.S. Pat. No. 4,027,100 and in U.S. Pat. No. 4,075,655 (Canadian Patent Application No. 294,484, filed Apr. 2, 1976), by Yukihiko Iijima, Kazumoto Iinuma, and Tatsuo Ishiguro, assignors to the instant assignee. It is to be noted here for a better understanding of the appended claims that the prediction error signal responsive to which the switching signal is produced in the illustrated circuit is derived from the autocorrelated signal X, the first prediction signal $X^1$, and the specific one of the second prediction signals $X^{2R}$.

Figure 3:
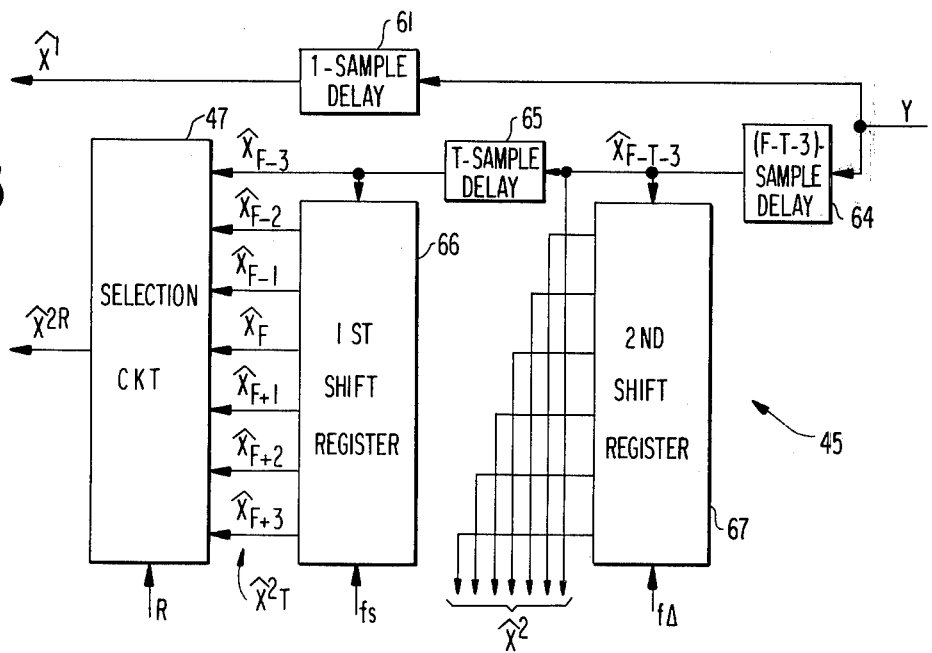
FIG. 3 is a block diagram of several prediction signal-producing circuits for use in the predictive encoder illustrated in FIG. 2.

Referring now to FIG. 3, the prediction signal-producing circuits 45 may comprise an intraframe prediction signal-producing circuit 61 and a movement prediction signal-producing circuit which is equivalent in the illustrated example to seven prediction signal-producing circuits. The intraframe prediction signal-producing circuit 61, is, for example, a one-sample delay circuit responsive to the locally decoded signal Y for producing as the first prediction signal $X^1$ a signal predictive of the value that the T-sample delayed autocorrelated signal will take a sampling period after. It is to be noted here that the signals are illustrated with the T-sample delays thereof omitted and, consequently, that the delayed autocorrelated signal is designated by X (not shown in FIG. 3) rather than by $X_T$ while the undelayed second prediction signals, by $X^2_{-T}$. The movement prediction signal-producing circuit comprises an (F − T − 3)-sample delay circuit 64 responsive to the locally decoded signal Y for producing an (F − T − 3)-sample delayed signal $X_{F-T-3}$. Here, a symbol F represents a frame period in terms of the equal spacings. The latter circuit further comprises a T-sample delay circuit 65 for producing an (F − 3)-sample delayed signal $X_{F-3}$ and a first six-stage shift register 66 stepped by the sampling pulses $f_s$ for producing an (F − 2)-sample delayed signal $X_{F-2}$ through an (F + 3)-sample delayed signal $X_{F+3}$, which signals are supplied to the selection circuit 47 together with the (F − 3)-sample delayed signal $X_{F-3}$ as the delayed second prediction signals $X^2$. When the value that the autocorrelated signal X takes at each of the successive instants should be varied among the values that the autocorrelated signal takes at the respective instants within a time interval ranging between a predetermined duration, such as a frame period, plus and minus a preselected number n of the equal spacings, the shift register 66 should have 2n stages. The prediction signal-producing circuits 45 further comprise a second six-stage shift register 67 stepped also by the sampling pulses $f_s$ and supplied with the (F − T − 3)-sample delayed signal $X_{F-T-3}$ for producing (F − T − 2)-sample through (F − T + 3)-sample delayed signals $X_{F-T-2}$ through $X_{F-T+3}$, which are supplied together with the (F − T − 3)-sample delayed signal $X_{F-T-3}$ to the first comparator 46 as the second prediction signals $X^2_{-T}$ advanced by T samples relative to the second prediction signals $X^2$ or $X_{F-3}$ through $X_{F+3}$ delivered to the selection circuit 47.

In essence, the circuit of FIG. 3 operates as follows. Firstly, the reconstructed autocorrelation signal sample Y is delayed one sample period to produce the prediction signal $X^1$. This may be thought of as a prediction that at a sample period later, the value of X will not have changed.

The $X^2$ samples are based on the premise that the same picture element in the next frame, or a closely adjacent picture element in the next frame, will correspond to the given picture element —i.e., Y. Which of the next frame picture elements will correspond best to the given element depends on the movement of the picture object from frame to frame. Thus, we delay the picture element Y by a frame ($X_F$) and by a few periods more than ($X_{F+3}$) and a few periods less than a frame ($X_{F-3}$). This permits us to make a comparison with the actual signal $X_F$ to see which of the group of second predicted signals is the closest match. The only difference between the first and second shift registers is the delay of a single sample period interposed therebetween. This is needed because the comparator 46 compares at one instant and selection R of the matching second predictive signal occurs a sample period T later.

Referring to FIG. 4, the first comparator 46 may comprise a subtractor circuit 71 for subtracting the autocorrelated signal X from a first through a seventh one of the second prediction signals $X^2$ or $X_{F+3}$ supplied from the (F − T − 3)-sample delay circuit 64 and the second shift register 67 to produce first through seventh difference signals $D_1$ through $D_7$. It is to be noted that the second prediction signals $X^2$ are for the undelayed autocorrelated signal X. The first comparator 46 further comprises a two-step quantizer circuit 72 for comparing the difference signals $D_1$ through $D_7$ with a reference signal of a reference level L to produce first through seventh comparison result signals $C_1$ through $C_7$ which are, for example, of a logic "1" and a logic "0" value when the difference signals $D_1$ through $D_7$ are of a level higher and not higher than the reference level L, respectively, a counter circuit 73 for counting the logic "0" values of each of the comparison signals $C_1$ through $C_7$ to produce first through seventh sum signals $S_1$ through $S_7$ representative of sums of the logic "0" values of the respective comparison result signals $C_1$ through $C_7$, and a block circuit 74 responsive to the sampling pulses $f_s$ for producing block pulses once in each block interval to make the counter circuit 73 simultaneously produce the sum signals $S_1$ through $S_7$ and to reset the counter circuit 73. Inasmuch as a prediction signal is best predictive of the autocorrelated signal X when the difference therebetween is least for a certain duration of time, such as the block interval, a minimum of the sum signals $S_1$ through $S_7$ is selected by a minimum finder circuit 75 for producing the selection signal R which may be representative of the ordinal number of one of the second prediction signals $X^2$ that gives the minimum one of the sum signals $S_1$ through $S_7$.

In FIG. 5, the digital autocorrelated signal X takes actual values . . . , $X_{-2}$, $X_{-1}$, $X_0$, $X_1$, . . . at the respective instants which are grouped into block intervals . . . , $B_{-1}$, $B_0$, $B_1$, . . . as generally labelled B. The second prediction signals $X^2$ (FIG. 2) produced by the (F − T − 3)-sample delay circuit 64 and the second shift register 67 (FIG. 3) take predicted values . . . , $X_{31\ 2}$, $X_{-1}$, $X_0$, $X_1$, . . . as exemplified by three of the second prediction signals $X_{F-3}$, $X_F$ and $X_{F+3}$. With a delay of two samples relative to the autocorrelated signal X and consequently to the block intervals B, the first comparator 46 produces the selection signal R representative of the ordinal numbers . . . , $R_{-1}$, $R_0$, $R_1$, . . . of the consecutively numbered second prediction signals $X^2$. The two-sample delayed autocorrelated signal $X_T$ take the actual values . . . , $X_{-2}$, $X_{-1}$, $X_0$, $X_1$, . . . as illustrated.

Referring to FIG. 6, the minimum finder circuit 75 may comprise first through third first-stage comparators 81, 82 and 83 for comparing the first and second sum signals $S_1$ and $S_2$, the third and fourth sum signals $S_3$ and $S_4$, and the fifth and sixth sum signals $S_5$ and $S_6$, respectively, to produce first through third first-stage result signals $s_{11}$, $s_{12}$ and $s_{13}$, each representative of the smaller of the two sum signals. Each of the comparators used in the minimum finder circuit 75 can consist of a plurality of four-bit magnitude comparators SN7485, described in "Supplement to the TTL Data Book for Design Engineers," published in 1974 by Texas Instruments Inc., page S-119, cascaded as demonstrated on page S-126. The result signal $s_{11}$, for example, takes a logic "0" and a logic "1" value when the first sum signal $S_1$ is smaller and not smaller than the second sum signal $S_2$, respectively. Controlled by the respective ones of the result signals $s_{11}$ through $s_{13}$, first through third first-stage two-channel multiplexers 86, 87 and 88 select smaller ones $MIN(S_1, S_2)$, $MIN(S_3, S_4)$ and $MIN(S_5, S_6)$ of the respective sum signal pairs $S_1$ and $S_2$, $S_3$ and $S_4$, and $S_5$ and $S_6$ supplied thereto. The minimum finder circuit 75 further comprises first and second second-stage comparators 91 and 92 for the smaller sum signals $MIN(S_1, S_2)$ and $MIN(S_3, S_4)$ and for the smaller sum signal $MIN(S_5, S_6)$ and the seventh sum signal $S_7$ for likewise producing first and second second-stage result signals $s_{21}$ and $s_{22}$, respectively. First and second second-stage two-channel multiplexers 93 and 94 similarly produce smaller sum signals $MIN[MIN(S_1, S_2), MIN(S_3, S_4)]$ and $MIN[MIN(S_5, S_6), S_7]$, respectively. A third-stage comparator 96 produces a first third-stage result signal $s_{31}$ in a like manner. Under the control of the result signal $s_{31}$, a first common two-channel multiplexer 97 produces a second third-stage result signal $s_{32}$ which becomes logic "0" and logic "1" when the first third-stage result signal $s_{31}$ is logic "9" and when the first second-stage result signal $s_{21}$ takes a logic "0" and a logic "1" value, respectively. Controlled by the first and second third-stage result signals $s_{31}$ and $s_{32}$, a second common two-channel multiplexer 98 produces a third third-stage result signal $s_{33}$ which is preferably rendered logic "0" and logic "1" when the first and second third-stage result signals $s_{31}$ and $s_{32}$ are of a logic "0" and a logic "1" value, respectively, and when the second first-stage result signal $s_{12}$ takes a logic "0" and a logic "1" value, respectively. It is now possible to give the selection signal R by the third-stage result signals $s_{31}$ through $s_{33}$ —namely, by a three-bit binary signal. When the selection signal R is "000", "001", "010", ..., the minimum sum signal is the first, second, third, ... sum signals $S_1$, $S_2$, $S_3$, ..., respectively. When the selection signal is either "110" or "111", the minimum sum signal is the seventh sum signal $S_7$. By way of example, let the selection signal R be "010". Inasmuch as the first third-stage result signal $s_{31}$ is "0", the minimum sum signal is one of the first through fourth sum signals $S_1$ through $S_4$. Inasmuch as the first and second third-stage result signals $s_{31}$ and $s_{32}$ are "0" and "1", the first second-stage result signal $s_{21}$ is "1". This shows that the minimum sum signal is either the third or the fourth sum signal $S_3$ or $S_4$. Inasmuch as the third third-stage result signal $s_{33}$ is "0", it is decided that the third sum signal $S_3$ is the minimum sum signal.

Figure 7:
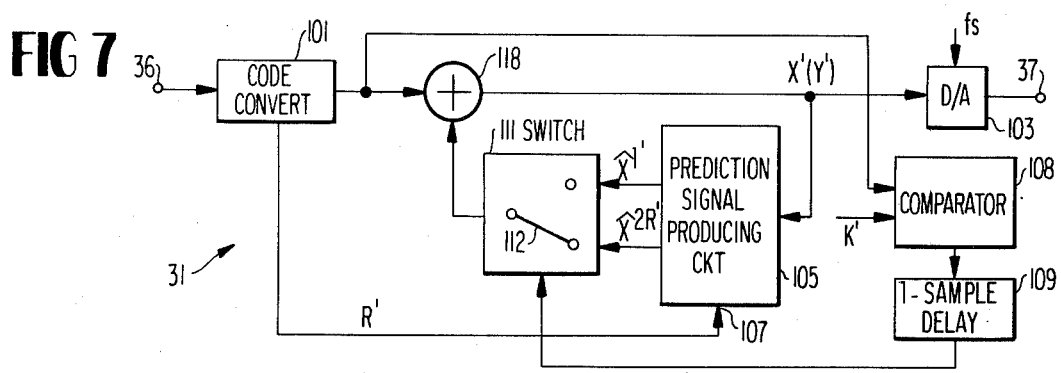
FIG. 7 is a block diagram of a predictive decoder according to a second embodiment of this invention for use in combination with the predictive encoder depicted in FIG. 2.

Turning to FIG. 7, a predictive decoder 31, according to a second embodiment of this invention, is for use in combination with the predictive encoder 21 illustrated with reference to FIG. 2 and has a decoder input terminal 36 for the encoded signal produced by the predictive encoder 21 and a decoder output terminal 37 for a reproduction of the analog autocorrelated signal. A code converter 101 inversely carries out the code conversion performed by the encoder code converter 41 to produce a reproduction of the prediction error signal and a reproduction of the selection signal R'. The reproduction of the autocorrelated signal is obtained by a digital-to-analog converter 103 from a reproduction of the digital autocorrelated signal X' that is produced as a decoded signal Y' as described hereunder. Supplied with the decoded signal X' or Y' at each of successive instants which are defined by a sampling pulse sequence regenerated with the above-mentioned sampling frequency $f_2$ for the predictive decoder 31 in the known manner, at least three prediction signal-producing circuits 105 simultaneously produce a first decoder prediction signal $X^{1'}$ and at least two second decoder prediction signals $X^{2'}$ (not shown in FIG. 7), all of which correspond to the first and second encoder prediction signals $X^1$ and $X^2$. More particularly, the first decoder prediction signal $X^{1'}$ is predicitve of the value that the reproduced autocorrelated signal X' takes the above-mentioned first predetermined duration after the instant of production of the first decoder prediction signal $X^{1'}$. The second decoder prediction signals $X^{2'}$ are predictive of the values that the reproduced autocorrelated signal X' takes the respective ones of the above-described second predetermined durations after the instant of simultaneous production of the second decoder prediction signals $X^{2'}$. Responsive to the reproduced selection signal R', a decoder selection circuit symbolized at 107 selects a particular one of the second decoder prediction signals $X^{2R'}$ which the reproduced selection signal R' is indicative of.

Further referring to FIG. 7, a decoder comparator 108 compares the amplitude of the reproduced prediction error signal with a decoder threshold level K' corresponding to the encoder threshold level K to produce at each of the successive instants a decoder binary signal of a logic "1" and a logic "0" value when the amplitude is greater and not greater in absolute value than the decoder threshold level K', respectively. The decoder binary signal is supplied to a one-sample delay circuit 109, which produces a decoder switching signal. It should be understood here for a better understanding of the appended claims that the prediction error signal from which the decoder switching signal is produced is derived from the encoded signal supplied to the predictive decoder 31. Responsive to the decoder switching signal, a decoder switching circuit 111 carries out switching between the first decoder prediction signal $X^{1'}$ and the particular one of the second decoder prediction signals $X^{2R'}$ to produce a decoder switched signal. The decoder switching circuit 111 is also biased, while inoperative, as symbolized by a mechanical switching arm 112 to produce, as soon as put into operation, one of the two decoder prediction signals $X^{1'}$ and $X^{2R'}$ that corresponds to the predetermined one of the two encoder prediction signals $X^1$ and $X^{2R}$. The decoder switched signal is added to the reproduced prediction error signal by an adder 118 to provide the decoded signal Y', which provides the reproduced digital autocorrelated signal X'.

Figure 8:
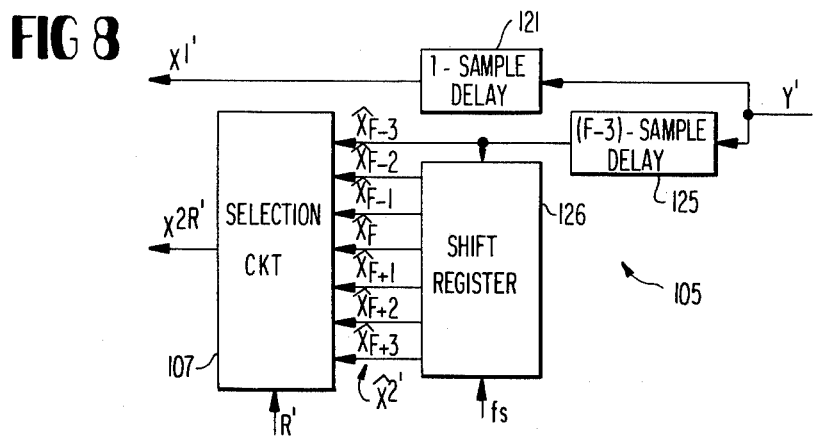
FIG. 8 is a block diagram of several prediction signal-producing circuits for use in predictive decoder illustrated in FIG. 7 in correspondence to the prediction signal-producing circuits shown in FIG. 3.

Referring to FIG. 8, the decoder prediction signal-producing circuits 105 for use in the predictive decoder 31 illustrated with reference to FIG. 7 in correspondence to the encoder prediction signal-producing circuits 45 shown in FIG. 3 comprise a decoder intraframe prediction signal-producing circuit 121 responsive to the decoded signal Y' or the reproduced digital autocorrelated signal X' for producing the first decoder prediction signal $X^{1'}$. An (F − 3)-sample delay circuit 125 corresponds to a combination of the (F − T − 3)-sample and T-sample delay circuits 64 and 65 used in the encoder prediction signal-producing circuits 45 and produces an (F − 3)-sample delayed signal $X_{F-3}'$. A single six-stage shift register 126 corresponding to the first shift register 66 produces (F − 2)-sample through (F + 3)-sample delayed signals $X_{F-2}'$ through $X_{F+3}'$, which signals serve as the second decoder prediction signals $X^{2'}$ in cooperation with the (F − 3)-sample delayed signal $X_{F-3}'$ and are supplied to the decoder selection circuit 107.

Figure 9:
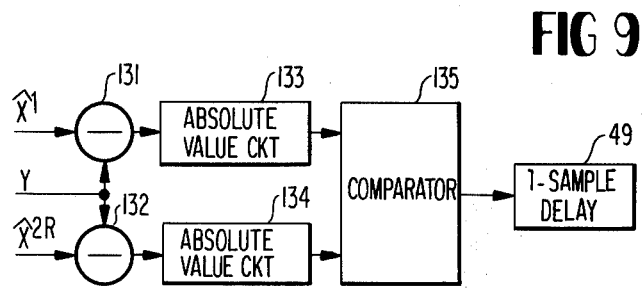
FIG. 9 is a block diagram of a modification of a second comparator for use in the predictive encoder shown in FIG. 2 or a decoder comparator for use in the predictive decoder depicted in FIG. 7.

Referring to FIG. 9, a comparator circuit is for use in place of the second comparator 48 in the predictive encoder 21 shown in FIG. 2 and may be deemed to be a modification of the comparator 48. Note that the circuit of FIG. 9 has different input connections than the circuit 48 of FIG. 2. A first substractor 131 and a second subtractor 132 subtract the locally decoded signal Y from the first encoder prediction signal $X^1$ and the specific one of the second encoder prediction signals $X^{2R}$, respectively. First and second absolute value circuits 133 and 134 calculate absolute values $|X^1 − Y|$ and $|X^{2R} − Y|$ of the differences calculated by the subtractors 131 and 132. A comparator 135 compares the absolute values with each other to produce a binary signal which takes a logic "0" and a logic "1" value when, for example, one of the absolute values $|Y^1 − Y|$ is greater than the other $|X^{2R} − Y|$ and otherwise, respectively. The binary signal is supplied to the one-sample delay circuit 49. With the switching signal thus produced, the switching circuit 51 selects the first prediction signal $X^1$ and the specific one of the second prediction signals $X^{2R}$ when the switching signal takes the logic "0" and logic "1" values, respectively. The modified comparator is applicable also to the decoder comparator 108. It is to be noted for a better understanding of the appended claims that are locally decoded signal Y is derived from the autocorrelated signal X, the first prediction signal $X^1$, and the specific one of the second prediction signals $X^{2R}$ and that the first decoder prediction signal $X^{1'}$, the particular one of the second decoder prediction signals $X^{2R'}$, and the decoded signal Y' are derived from the decoder prediction error signal and the reproduced selection signal which, in turn, are derived from the encoded signal supplied to the predictive decoder 31. With this modified comparator, it is possible to raise the accuracy of prediction as compared with the comparators 48 and 108 depicted in FIGS. 2 and 7.

Figure 10:
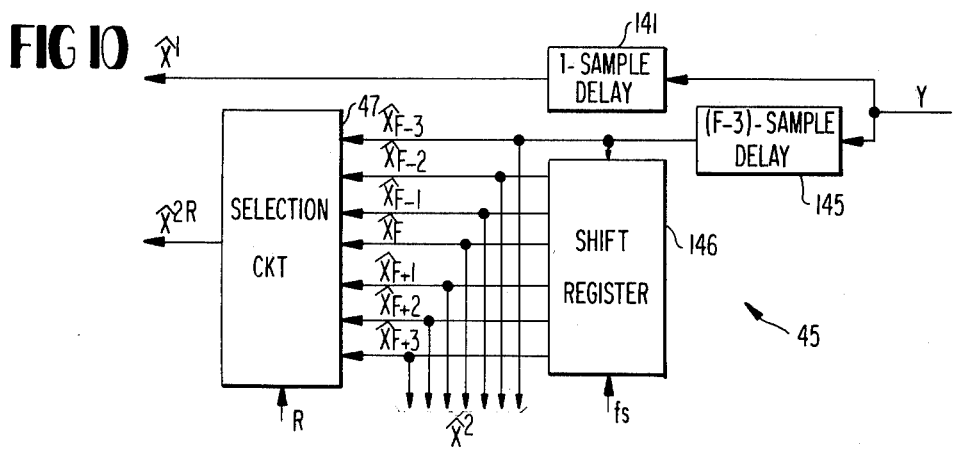
FIG. 10 is a block diagram of a modification of the encoder prediction signal-producing circuits illustrated in FIG. 3.

Referring to FIG. 10, a modification of the encoder prediction signal-producing circuits 45 illustrated with reference to FIG. 3 comprises similar circuit elements 141, 145 and 146 as the elements 121–125 and 126 described in conjunction with FIG. 8. It is to be noted here that the (F − 3)-sample through (F + 3)-sample delayed signals $X_{F-3}$ through $X_{F+3}$ are branched to be delivered to the first comparator 46. With these modified circuits 45, the selection circuit 47 produces the specific one of the second prediction signals $X^{2R}$ in response to the selection signal R produced in the next previous block interval. The T-sample delay circuit 56 for the autocorrelated signal should be omitted.

Figure 11:
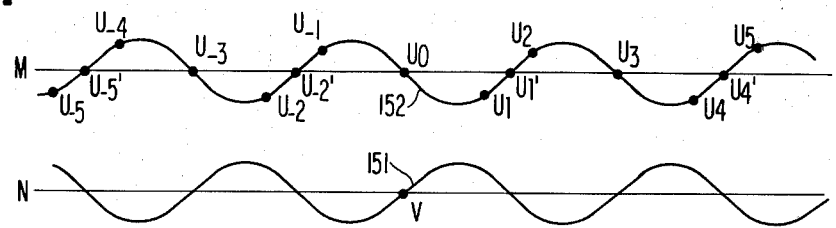
FIG. 11 shows a chrominance subcarrier signal of a color television signal in two successive frames for describing principles of a plurality of prediction signal-producing circuits.

Turning to FIG. 11, a lower curve 151 represents the phases of a chrominance subcarrier signal of a color television signal in a horizontal line period of one of the frame periods N while an upper curve 152, the phases of the chrominance subcarrier signal in a horizontal line period which corresponds in a next previous frame period M to the horizontal line period mentioned above. Let it be assumed that the color television signal is sampled with a sampling frequency $f_s$ equal to about three times the subcarrier frequency and that a point V designates a particular sampling instant in the present frame period N. Sampling instants in the previous frame period M are denoted at ..., $U_{-5}$ ..., $U_{-1}$, $U_0$, $U_1$, ..., $U_5$, ... among which the instant $U_0$ is a frame period next previous to the particular sampling instant V. The frame-to-frame predictive encoding in which the value of the television signal at the particular sampling instant V is predicted by the value at the previous sampling instant $U_0$ provides a high efficiency for a monochrome television signal but does not for a color television signal because the subcarrier signal is phase opposite at the instants V and $U_0$. It is therefore necessary for a color television signal to use different sampling instants ..., $U_{-5}'$, $U_{-2}'$, $U_1'$, $U_4'$, ... at which the subcarrier signal has the same phase as at the particular sampling instant V. The different sampling instants, such as $U_{-5}'$, $U_{-2}'$ and $U_1'$, are most conveniently given by linear interpolation between the sampling instants $U_{-5}$ and $U_{-4}$, $U_{-2}$ and $U_{-1}$, and $U_1$ and $U_2$, respectively.

Figure 12:
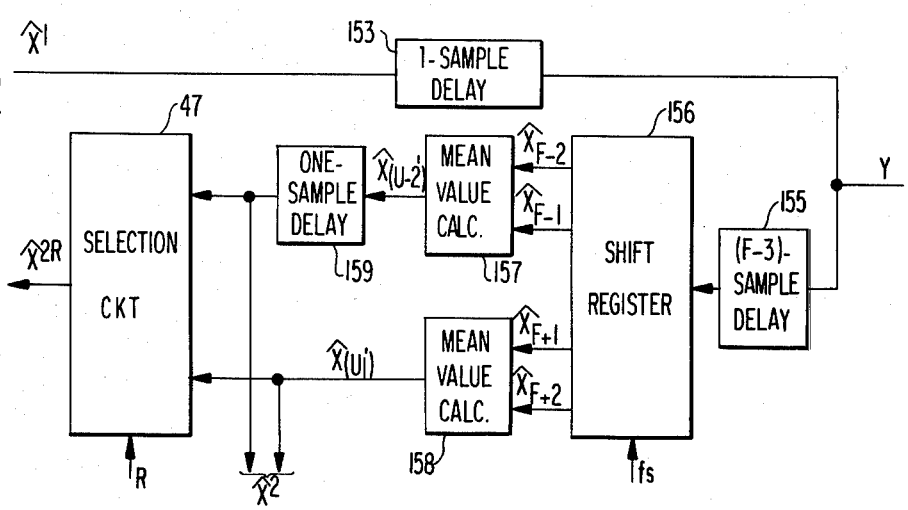
FIG. 12 is a block diagram of a plurality of prediction signal-producing circuits based on the principles illustrated with reference to FIG. 11.

Referring to FIG. 12, a plurality of prediction signal-producing circuits for use in place of the prediction signal-producing circuits 45 illustrated with reference to FIG. 3 or FIG. 10 comprise an intraframe prediction signal-producing circuit 153 responsive to the locally decoded signal Y for producing a first prediction signal $X^1$, an (F − 3)-sample delay circuit 155 for producing an (F − 3)-sample delayed signal $X_{F-3}$ (not shown in FIG. 12), and a shift register 156 stepped by the sampling pulses $f_s$ to provide (F − 2)-sample through (F + 2)-sample delayed signals $X_{F-2}$ through $X_{F+2}$. Use is not made herein of the F-sample delayed signal $X_F$ and an (F − 3)-sample delayed signal. Mean value calculators 157 and 158 calculate the arithmetic means values of the (F − 2)-sample and (F − 1)-sample delayed signals and the (F + 1)-sample and (F + 2)-sample delayed signals to produce $U_{-2}'$-point and $U_1'$-point signals $X(U_{-2}')$ and $X(U_1')$, respectively, which are supplied as the second prediction signals $X^2$ to the selection circuit 47 and to the first comparator 46. An additional one-sample delay circuit 159 is used for the $U_{-2}'$-point signal $X(U_{-2}')$ to establish correspondence between the sampling instants $U_{-2}'$ and V. These prediction signal-producing circuits are applicable to the predictive decoder 31. It is possible to use the illustrated prediction signal-producing circuits in combination with the prediction signal-producing circuits 45 illustrated with reference to FIG. 3 or FIG. 10 or with the prediction signal-producing circuits 105 described with reference to FIG. 8 and to branch pertinent output signals of the shift register 66, 67, 126 or 146, such as $X_{F-2}$ and $X_{F-1}$, to the mean value calculators, such as 157. This renders the predictive encoder 21 and decoder 31 compatible.

Figure 13:
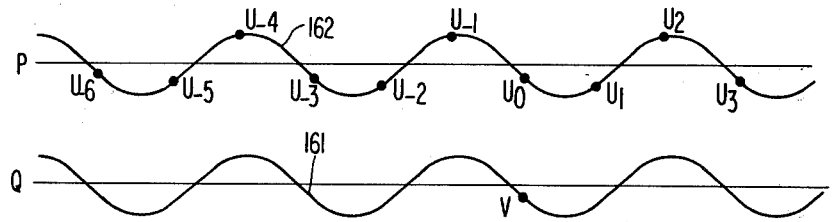
FIG. 13 shows a chrominance subcarrier signal of a color television signal in two of the fields for describing principles of a plurality of prediction signal-producing circuits.

Referring now to FIG. 13, a lower curve 161 respresents the phases of a chrominance subcarrier signal of a color television signal in a horizontal line period of one of the field periods Q, while an upper curve 162 represents the phases of the chrominance subcarrier signal in a horizontal line period corresponding to the lower depicted horizontal line period in another field period P, such as a next previous field period, where the subcarrier signal has the same phase as in the present field period Q. Sampling instants are again labelled ..., $U_{-5}$, ..., $U_{-1}$, $U_0$, $U_1$, ..., $U_3$, ... and V. The subcarrier signal is inphase at sampling instants ..., $U_{-6}$, $U_{-3}$, $U_0$, $U_3$, ... and V.

Figure 14:
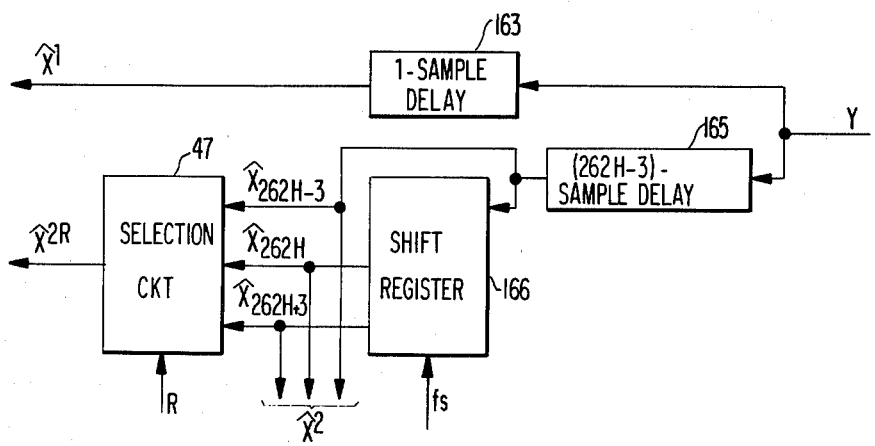
FIG. 14 is a block diagram of a plurality of prediction signal-producing circuits based on the principles illustrated with reference to FIG. 13.

Referring finally to FIG. 14, a plurality of prediction signal-producing circuits are for use in place of the prediction signal-producing circuits illustrated with reference to FIG. 12 and are for a color television signal of with a frame period is equal to 525 horizontal line periods with 2:1 interlaced scanning. The prediction signal-producing circuits comprise an intraframe prediction signal-producing circuit 163 for a first prediction signal $X^1$, a $(262H - 3)$-sample delay circuit 165 for producing a $(262H - 3)$-sample delayed signal $X_{262H-3'}$, and a shift register 166 stepped by a pulse sequence of the horizontal scanning frequency $f_h$ to produce 262H-sample and $(262H + 3)$-sample delayed signals $X_{262H}$ and $X_{262H+3}$. A symbol H herein used represents a horizontal line period in terms of the equal spacing. Together with the $(262H - 3)$-sample delayed signal $X_{262H-3}$, the 262H-sample and $(262H + 3)$-sample delayed signals $X_{262H}$ and $X_{262H+3}$ are supplied as the second prediction signals $X^2$ to the selection circuit 47 and to the first comparator 46. These prediction signal-producing circuits are applicable also as well to the predictive decoder 31.

While several preferred embodiments of this invention have so far been described, it is now readily possible for those skilled in the art to modify the illustrated embodiments in various manners. For example, it is possible to use the selection circuits 47 or 107 to select at least two of at least three prediction signals rather than a specific or particular one of the second prediction signals.

What is claimed is:

1. A system comprising a predictive encoder for producing an encoded signal representative of an autocorrelated signal supplied thereto and a predictive decoder responsive to said encoded signal for reproducing said autocorrelated signal, said autocorrelated signal taking those values at equally-spaced successive instants which are substantially correlated to the values said autocorrelated signal takes each of a plurality of predetermined durations after the respective instants, one of said predetermined durations being equal at least to the equal spacing between two adjacent ones of said instants, others of said predetermined durations being longer than said one predetermined duration, said encoded signal comprising a prediction error signal and a control signal interspersed in said prediction error signal, said prediction error signal having an amplitude variable from one of said instants to another thereof in compliance with said autocorrelated signal, said predictive encoder comprising:

encoder prediction means responsive to an encoder local signal supplied thereto at each of said instants for producing a group of at least three encoder prediction signals of predicted values predictive with approximation of actual values that said autocorrelated signal takes at least three of said predetermined durations after said each instant, respectively, said predicted values thereby corresponding to said actual values, respectively;

first encoded means responsive to said autocorrelated signal and a subgroup of said prediction signals for comparing said predicted values with the corresponding ones of said actual values to produce once in each block interval, equal to a predetermined number of said equal spacings, a selection signal indicative of the one of said subgroup of prediction signals providing the best approximation of said autocorrelation signal;

encoder selection means responsive to said selection signal for providing at output thereof at least two of said encoder prediction signals, at least one being determined by said selection signal;

second encoder means responsive to said autocorrelated signal and said at least two prediction signals for producing at each of said instants an encoder switching signal according to a first predetermined rule;

encoder switching means responsive to said switching signal for selecting one of said at least two prediction signals as an encoder switched signal according to a second predetermined rule;

means responsive to said autocorrelated signal and said encoder switched signal for producing said prediction error signal;

means responsive to said prediction error signal and said switched signal for producing said local signal; and means for interspersing said selection signal in said prediction error signal as said control signal.

2. A system as claimed in claim 1 wherein said predictive decoder comprises:

decoder prediction means responsive to a decoder local signal supplied thereto at each of said intants for producing at least three decoder prediction signals predictive of the values that the reproduced autocorrelated signal takes said at least three predetermined durations, respectively, after the instant of production of said decoder prediction signals;

means responsive to the encoded signal supplied to said predictive decoder for reproducing the prediction error signal and the selection signal;

decoder selection means responsive to the reproduced selection signal or providing at outputs thereof at least two of said decoder prediction signals, at least one of which is determined by said reproduced selection signal;

means responsive to the encoded signal supplied to said predictive decoder for producing at each of said instants a decoder switching signal according to a rule corresponding to said first predetermined rule;

decoder switching means responsive to said decoder switching signal for selecting according to said second predetermined rule one of said at least two decoder prediction signals as a decoder switched signal;

means responsive to said reproduced prediction error signal and said decoder switched signal producing said decoder local signal; and means for producing said decoder local signal as said reproduced autocorrelated signal.

3. A predictive encoder for producing an encoded signal representative of an autocorrelated signal supplied thereto, said autocorrelated signal taking those values at equally-spaced successive instants which are substantially correlated to the values said autocorrelated signal takes each of a plurality of predetermined durations after the respective instants, one of said predetermined durations being equal at least to the equal spacing between two adjacent ones of said instants, others of said predetermined durations being longer than said one predetermined duration, said encoded signal comprising a prediction error signal and a control signal interspersed in said prediction error signal, said prediction error signal having an amplitude variable from one of said instants to another thereof in compliance with said autocorrelated signal, said predictive encoder comprising:

encoder prediction means responsive to an encoder local signal supplied thereto at each of said instants for producing at least three encoder prediction signals of predicted values predictive with approximation of actual values that said autocorrelated signal takes at least three of said predetermined durations after said each instant, respectively, said predicted values thereby corresponding to said actual values, respectively;

first encoder means responsive to said autocorrelated signal and a group of said prediction signals for comparing said predicted values with the corresponding ones of said actual values to produce once in each block interval, equal to a predetermined number of said equal spacings, a selection signal indicative of the one said group of prediction signals which is the best approximation of said autocorrelated signal;

encoder selection means responsive to said selection signal for selecting at least two prediction signals, at least one of which is determined by said selection signal;

second encoder means responsive to said autocorrelated signal and said at least two prediction signals for producing at each of said instants an encoder switching signal according to a first predetermined rule;

encoder switching means responsive to said switching signal for selecting according to a second predetermined rule one of said at least two prediction signals as an encoder switched signal;

means responsive to said autocorrelated signal and said switched signal for producing said prediction error signal;

means responsive to said prediction error signal and said switched signal for producing said encoder local signal; and means for interspersing said selection signal in said prediction error signal as said control signal.

4. A predictive encoder as claimed in claim 3, said predetermined durations comprising a first predetermined duration and at least two second predetermined durations wherein:

said encoder prediction means comprises first encoder prediction means responsive to the local signal supplied thereto at each of said instants for producing a first encoder prediction signal of a first predicted value predictive with approximation of a first actual value that said autocorrelated signal takes said first predetermined duration after the instant of production of said first prediction signal, and second encoder prediction means responsive to the local signal supplied thereto at each of said instants for simultaneously producing a plurality of second encoder prediction signals of second predicted values predictive with approximation of second actual values that said autocorrelated signal takes the respective ones of said second predetermined durations after the instant of simultaneous production of said second prediction signals, said second predicted values thereby corresponding to said second actual values, respectively;

said first encoder means comprising means responsive to said autocorrelated signal and said second prediction signals for comparing said second predicted values with the corresponding ones of said second actual values for producing said selection signal indicative of the one of said second prediction signals providing the best approximation of said autocorrelated signal;

said encoder selection means comprising means responsive to said selection signal for selecting said one of said second prediction signals; and said encoder switching means comprising means responsive to said switching signal for selecting as said switched signal one of said first prediction signals and said one of said second prediction signals.

5. A predictive encoder as claimed in claim 4 wherein said means for producing said selection signal comprises:

means responsive to said autocorrelated signal and said second prediction signals for producing difference signals of values equal to differences between said second actual values and the respective ones of said second predicted values;

means responsive to said difference signals and a reference signal of a reference value for comparing said differences with said reference value to produce binary signals corresponding to the respective ones of said second predicted values, each of said binary signals taking one and the other of binary values when the second predicted value corresponding thereto is greater and not greater than said reference value, respectively;

means responsive to said binary signals for adding the other binary values of each of said binary signals for said block interval to produce sum signals representative of sums of said other binary values of the respective ones of said binary signals; and means responsive to said sum signals for finding a minimum of said sums to produce as said selecting signal a signal indicative of one of said second prediction signals from which said minimum sum results.

6. A predictive encoder as claimed in claim 4 wherein said second encoder means comprises means for comparing at each of said instants the amplitude of the prediction error signal derived from said autocorrelated signal, said first prediction signal, and said one of said second prediction signals with a predetermined threshold level to produce said switching signal.

7. A predictive encoder as claimed in claim 4 wherein said second encoder means comprises means responsive to said first prediction signal and said local encoder signal for producing a first error signal of a value corresponding to the difference thereof, means responsive to said one of said second prediction signals and said local encoder signal for producing a second error signal, and comparator means responsive to said first and second error signals for producing a binary switching signal indicative of which of said error signals has the largest absolute value.

8. A predictive decoder for use in combination with the predictive encoder of claim 3, said predictive decoder being responsive to said encoded signal for reproducing said autocorrelated signal and comprising:

decoder prediction means responsive to a decoder local signal supplied thereto at each of said instants for producing at least three decoder prediction signals predictive of the values that the reproduced autocorrelated signal takes said at least three predetermined durations, respectively, after the instant of production of said decoder prediction signals;

means responsive to the encoded signal supplied to said predictive decoder for reproducing the prediction error signal and the selection signal;

decoder selection means responsive to the reproduced selection signal for providing at an output thereof at least two of said decoder prediction signals, one of which said reproduced selection signal is indicative of;

decoder means responsive to the encoded signal supplied to said predictive decoder for producing at each of said instants a decoder switching signal according to a rule corresponding to said first predetermined rule;

decoder switching means responsive to said decoder switching signal for selecting according to said second predetermined rule one of said at least two decoder prediction signals as a decoder switched signal;

means responsive to said reproduced prediction error signal and said decoder switched signal for producing said decoder local signal; and means for producing said decoder local signal as said reproduced autocorrelated signal.

9. A predictive decoder as claimed in claim 8, said predetermined durations comprising a first predetermined duration and at least two second predetermined durations wherein:

said decoder prediction means comprises first decoder prediction means responsive to the decoder local signal supplied thereto at each of said instants for producing a first decoder prediction signal predictive of the values that said reproduced autocorrelated signal takes said first predetermined duration after the instant of production of said first decoder prediction signal, and second decoder prediction means responsive to the decoder local signal supplied thereto at each of said instants for simultaneously producing a plurality of second decoder prediction signals predictive of the values that said reproduced autocorrelated signal takes the respective ones of said second predetermined durations after the instant of simultaneous production of said second decoder prediction signals, said reproduced selection signal being indicative of one of said second decoder prediction signals;

said decoder selection means comprising means responsive to said reproduced selection signal for selecting said one of said second decoder prediction signals;

said decoder switching means comprising means responsive to said decoder switching signal for selecting as said decoder switched signal one of said first decoder prediction signals and said one of said second decoder prediction signals.

10. A predictive decoder as claimed in claim 9 wherein said decoder means comprises means for comparing at each of said instants the amplitude of said reproduced prediction error signals derived from the encoded signal supplied to said predictive decoder with a predetermined threshold level to produce said decoder switching signal.

11. A predictive decoder as claimed in claim 9 wherein said decoder means comprises means responsive to said first prediction signal and said local encoder signal for producing a first error signal of a value corresponding to the difference thereof, means responsive to said one of said second prediction signals and said local encoder signal for producing a second error signal, and comparator means responsive to said first and second error signals for producing a binary switching signal indicative of which of said error signals has the largest absolute value.

* * * * *

UNITED STATES PATENT AND TRADEMARK OFFICE
CERTIFICATE OF CORRECTION

PATENT NO. : 4,144,543

DATED : March 13, 1979

INVENTOR(S) : Toshio KOGA

It is certified that error appears in the above-identified patent and that said Letters Patent are hereby corrected as shown below:

Column 1, line 45 - Between "provides" and "result" insert -- a --

Column 3, line 33 - After "least" delete "the"

Column 4, line 28 - After "use in" insert -- the --

Column 5, line 63 - Delete "first" insert -- best --

Column 7, line 15 - After "61" delete " , "

Column 8, line 51 - Delete "$X_{31\,2}$," insert -- $X_{-2}$, --

Column 10, line 7 - Delete "$f_2$" insert -- $f_s$ --

UNITED STATES PATENT AND TRADEMARK OFFICE
CERTIFICATE OF CORRECTION

PATENT NO. : 4,144,543

DATED : March 13, 1979

INVENTOR(S) : Toshio KOGA

It is certified that error appears in the above-identified patent and that said Letters Patent are hereby corrected as shown below:

Column 11, line 24 - Delete "$|Y^1 - Y|$" insert -- $|X^1 - Y|$ -- line 34 - After "that" delete "are" insert -- the --

IN THE CLAIMS:

Column 13, line 60 - Delete "encoded" insert -- encoder --

Column 14, line 25 - Delete "intants" insert -- instants -- line 50 - After "signal" insert -- for --

Signed and Sealed this

Nineteenth Day of June 1979

[SEAL]

Attest:

RUTH C. MASON
*Attesting Officer*

DONALD W. BANNER
*Commissioner of Patents and Trademarks*